United States Patent [19]

Cazaux et al.

[11] Patent Number: 4,873,562
[45] Date of Patent: Oct. 10, 1989

[54] CHARGE-COUPLED DEVICE WITH LOWERING OF TRANSFER POTENTIAL AT OUTPUT AND FABRICATION METHOD THEREOF

[75] Inventors: Yvon Cazaux; Yves Thenoz, both of Grenoble; Didier Herault, Weyssinet; Pierre Blanchard, Verrieres le Buisson, all of France

[73] Assignee: Thomson-CSF, Paris, France

[21] Appl. No.: 287,887

[22] Filed: Dec. 21, 1988

[30] Foreign Application Priority Data

Dec. 22, 1987 [FR] France .................. 87 17880

[51] Int. Cl.[4] ............... H01L 29/78; G11C 19/28
[52] U.S. Cl. .......................... 357/24; 377/61
[58] Field of Search .............. 357/24; 377/57–63

[56] References Cited

U.S. PATENT DOCUMENTS

| | | | |
|---|---|---|---|
| 3,796,932 | 3/1974 | Amelio et al. | 357/24 |
| 3,852,799 | 12/1974 | Walden | 357/24 |
| 4,206,371 | 6/1980 | Weimer | 357/24 |
| 4,262,217 | 4/1981 | Levine | 357/24 |
| 4,580,155 | 4/1986 | Tsoi et al. | 357/24 |
| 4,621,369 | 11/1986 | Narabu et al. | 357/24 |
| 4,625,322 | 11/1986 | Tukazaki et al. | 357/24 |
| 4,777,519 | 10/1988 | Oshima | 357/24 |
| 4,807,037 | 2/1989 | Iesaka et al. | 357/24 |

FOREIGN PATENT DOCUMENTS

0192142 8/1986 European Pat. Off. .

Primary Examiner—Gene M. Munson
Attorney, Agent, or Firm—Oblon, Spivak, McClelland, Maier & Neustadt

[57] ABSTRACT

Disclosed are a charge-coupled device with lowering of output potential as well as a method for the fabrication of this device. In a known way, the device comprises, upstream on a semiconducting substrate with a first type of doping (P), a semiconducting layer with a second type of doping (N) and an insulating layer covering the former layer. Pairs of electrodes are formed on the insulating layer. Each pair has a transfer electrode and a storage electrode. Zones with a third type of doping N+) are made in the layer of a second type (N). A layer with a third type of doping (N−) is made downstream, in the layer with a second type of doping, and, downstream, there is formed at least one other pair of additional transfer and storage electrodes. A zone with a fourth type of doping (N−−) is made beneath the additional transfer electrode in the layer with a third type of doping (N−). This pair of additional electrodes and the zone with a fourth type of doping make it possible to obtain the lowering of transfer potential at output.

5 Claims, 5 Drawing Sheets

CHARGE-COUPLED DEVICE WITH LOWERING OF TRANSFER POTENTIAL AT OUTPUT AND FABRICATION METHOD THEREOF

BACKGROUND OF THE INVENTION

1. Field of the Invention

The present invention concerns a charge-coupled device with lowering of transfer potential at output, as well as a method for the fabrication of this device.

It can be applied to the making of memories, shift registers, delay lines, television cameras etc.

2. Description of the Prior Art

Charge-coupled devices are semiconductor-based systems wherein the charges are stored in potential wells. These charges are created at the surface of a semiconductor layer generally formed on a substrate, or at the interface between the semiconductor layer and an insulating surface layer (in a so-called buried-channel device). The charges are transferred from an upstream position towards a downstream position in successively occupying, through transfer potentials, all the potential wells created between these two positions. In general, and to put it in a very simplified way, these devices comprise a semiconductor substrate with a certain type of doping, a layer of an insulating material, and a set of electrodes on this insulating layer carried to appropriate potentials. This insulating material may be an oxide. The charges shifted in devices of this type are electrons.

Figure 1:
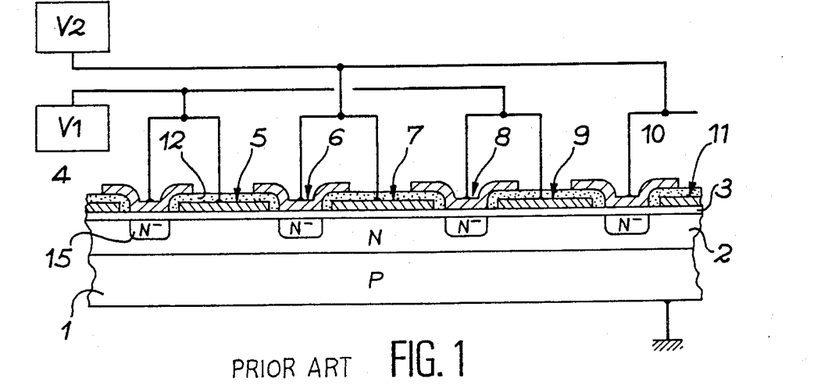
FIGS. 1, 2 and 3, which have already been described, provide a clearer understanding of the structure and working of a known device according to the prior art.

Another known type of charge-coupled device, which is more efficient than the above ones, is shown schematically, in a sectional view, in FIG. 1. This device comprises, on the semiconductor substrate with a first type of doping (P type doping for example), a semiconducting layer 2 with a second type of doping (N type). An insulating layer 3 (an oxide for example) coats the semiconducting layer 2. This device also has at least one first pair of electrodes 4, 5 and at least one second pair of electrodes 6, 7, along an axis oriented in a direction X (FIG. 3), defining a direction of flow of the charges, said pairs of electrodes being between between an upstream position where the charges are created, and a downstream position. This figure also shows other pairs of electrodes 8, 9 and 10, 11, which are identical to the preceding pairs of electrodes. The charges are created on the upstream (of the electrode 4) position side by prior art means which shall therefore not be shown.

Each pair of electrodes such as 4, 5, has, in the direction of flow X, a transfer electrode 4, and a charge storage electrode 5. These electrodes are in contact with the insulating layer 3, and the storage electrodes such as the electrode 5 are coated with an electrically insulating coat 12 (an oxide for example).

This known prior art device also has means which, combined with electrical potentials applied to the electrodes, enable the creation of potential wells of equal depths, beneath and facing the storage electrodes 5, 7, 9, and identical, disymmetrical, transfer potentials beneath and facing the transfer electrodes 4, 6, 8 . . . and the storage electrodes 5, 7, 9 . . . . These transfer potentials and these potential wells make it possible, in a known way, to cause the charges to flow in the chosen direction X. They appear at the interface between the semiconductor layer 2 and the insulating layer 3. In known way, the means used to create these potential wells and these transfer potentials comprise zones with a third type of doping (N⁻ in the example considered), which are made in the second type semiconducting layer 2, beneath and facing transfer electrodes 4, 6, 8 . . . etc. These means also have two electrical voltage sources V1, V2. The voltage source V1 is connected to the pairs of electrodes 4-12, 8-9, while the voltage source V2 is connected to the pairs of electroodes 6-7, 10-11.

Figure 2:
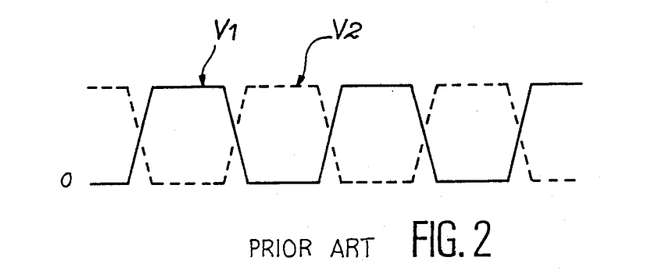

The voltages V1, V2 vary cyclically and in phase opposition between identical values, as shown in FIG. 2 (for example between the value 0 and a positive value).

In this type of device, since the potentials applied to the successive pairs of electrodes have the same extreme values, and the semiconducting layer 2 with a second type of doping (N for example) have identical zones 15 with a third type of doping (N⁻ for example), the potential wells beneath and facing the storage electrodes have the same depth throughout the length travelled by the charges in the device. The transfer potentials also have identical variations in levels throughout the length travelled.

Figure 3:
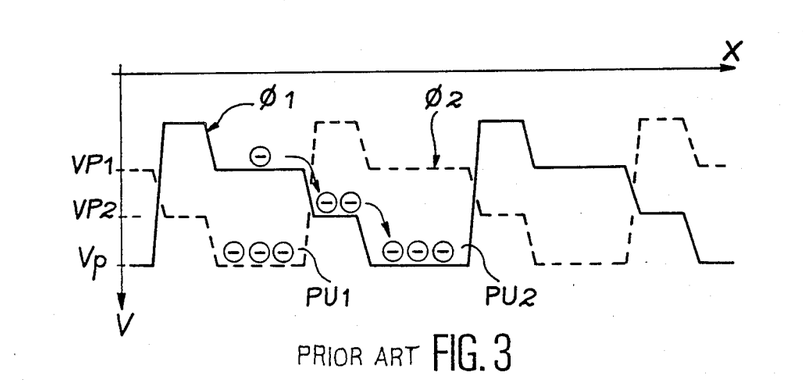

FIG. 3 gives a better understanding of the operation of this prior art device. This figure shows the profile of the potential V, along the length of the device of FIG. 1, in the direction of flow X. This potential is the one that appears at the interface between the semiconducting layer 2 and the insulating layer 3, when the voltages V1, V2, in phase opposition are applied to pairs of electrodes as indicated above. In this figure, the curve 01 corresponds to the surface potential appearing beneath the electrodes when the voltage V1 is applied to the corresponding electrodes, while the curve 02 represents the surface potential when the voltage V2 is applied to the corresponding electrodes. This surface potential depends on the density of the dopant at all points of the perpendicular to the point of the surface considered. It also depends on the potentials applied to the electrodes. The preence of the layer with a second type of doping (N in the example considered), beneath the electrodes 5, 7, 9, causes an increase in the depth of the potential well in this region. On the contrary, beneath the transfer electrodes, for which there is a zone with a third type of doping (N⁻ in the example considered) the potential well is not as deep. The result thereof is that, by causing variation in the potentials applied to the electrodes, there is created, in the interval between these electrodes, an asymmetric potential well which is deeper downstream than upstream. When the voltage V1 or V2, applied to the storage electrodes 5, 7, 9, is at a maximum, the depth of the potential wells PU1, PU2 . . ., created beneath the electrodes, is itself at a maximum, and is equal VP for example. The electrons are then stored in these potential wells as shown in FIG. 3. On the contrary, when the voltage applied to the corresponding storage and transfer electrode diminishes, the depth of the potential well diminishes and the electrons which were stored in the potential well PU1 are transferred to the potential well PU2 beneath the following storage electrodes. The potential bottom flat levels, such as VP1, VP2, favor this transfer.

It may be sometimes useful, especially (as shall be seen further below in greater detail) in an charge reading device located downstream, at the end or output of the device, to lower the values of the transfer potentials at this downstream end of the device.

At present, there is no device that provides a simple way to reduce the values of the bottom flat levels of the transfer potentials at a downstream end of a charge-coupled device. The result thereof is that the read amplifiers, which are connected to the downstream ends of known charge-coupled devices of the above-described type, have a supply voltage which is sometimes considerably higher than the electrical supply voltages of the assemblies in which these charge-coupled devices are used.

SUMMARY OF THE INVENTION

An object of the invention is to overcome these drawbacks and, in particular, to make a charge-coupled device, wherein it is possible to create, from a downstream position, along the axis of flow of the charges, at the interface of the semiconducting layer and the insulating layer, transfer potential bottom flat levels with lower values than those of the bottom flat levels of potentials appearing between the upstream and downstream positions, particularly in order to enable a considerable reduction in the value of the supply voltage of the read amplifier located at one end of the device, beyond the downstream position. Another object of the invention is to provide a very simple method for the fabrication of a device of this type.

An object of the invention is a charge-coupled device comprising:

a semiconductor substrate with first type of doping, a semiconductor layer with a second type of doping covering this layer, an insulating layer covering this semiconducting layer, and, along one and the same axis defining a direction of flow of charges between an upstream position and an downstream position, at least one first pair and one second pair of electrodes, each comprising, in said direction, a transfer electrode and a storage electrode having surfaces of contact with the insulating layer, with zones with a third type of doping being made so as to face the contact surfaces of the transfer electrodes of the first and second pairs, in the semiconducting layer of the second type, the electrodes of the first and second pairs being respectively connected to a first source and a second source of voltage varying cyclically and in phase opposition, between a first value and a second value, to create potential wells of equal depths, beneath and facing the storage electrodes, and identical and phase shifted potentials beneath and facing the transfer and storage electrodes of the first pair and the second pair, to make the charges flow in said direction; said device comprising, from the downstream position, along said axis, in the direction of flow:

a semiconducting layer with a third type of doping made in the layer with the second type of doping, at least one third pair of electrodes comprising, in said direction, a transfer electrode and a storage electrode having surfaces of contact with the insulating layer, and comprising means to create transfer potentials, beneath and facing the electrodes of the third pair, with values smaller than those of the transfer potentials beneath and facing the transfer and storage electrodes of the first pair and second pair.

The means used to create, from a downstream position, transfer potentials with values smaller than those of the potentials appearing between the upstream and downstream positions, may be compared to a hydraulic lock system since, conventionally, potential wells are compared to a bucket-brigade system where the liquid contained in one of the buckets is successively transferred from one bucket to another.

According to another characteristic of the invention, the means used to create, beneath and facing the electrodes of the third pair, transfer potentials with values below those of the first and second pairs of electrodes, comprise a zone with a fourth type of doping, beneath and facing the transfer electrode of the third pair, in the semiconducting layer with a third type of doping, the transfer and storage electrodes of the third pair being connected to a voltage source which varies cyclically and in phase with the voltage applied to the electrodes of the first pair, said voltage varying between said first value and a third value which is greater than the second value.

According to another characteristic of the invention, the semiconductor substrate, with a first type of doping has P type doping, the semiconductor layer with a second type of doping has N type doping, the semiconductor layer and the semiconductor zones with the third type of doping have $N^-$ type doping and have a lower level of doping than the semiconducting layer with the second type of doping, the semiconducting zone with the fourth type of doping being $N^{--}$ type doped, with a lower level of doping than the semiconducting layer that has a third $N^-$ type doping.

According to another characteristic, the device further has means to detect the charges that have collected beneath the storage electrode of the third pair, said means comprising an intermediate electrode which is adjacent to the storage electrode of the third pair and is in contact insulating layer, and a control electrode at a distance from the intermediate electrode in contact with the insulating layer, a semiconducting zone, with a fifth type of doping, made in the semiconducting layer with a third type of doping, in a zone beneath and facing the space located between the intermediate electrode and the control electrode, and a second semiconducting zone, with a fifth type of doping, made in the semiconducting layer with a third type of doping, in a zone adjacent to the control electrode, in the direction of the flow; the control electrode, the second zone and the intermediate electrode being respectively connected to sources to create a potential well beneath and facing the first zone with a smaller depth than that of the potential well beneath the storage electrodes of the first pair and the second pair, the first zone being connected to an amplifier for the measurement of the charges that collect in the potential well beneath and facing this first zone. According to another characteristic, the semiconducting zones with a fifth type of doping have $N^+$ type doping of a higher level than the semiconducting layer with the second type N doping.

The invention also concerns a method for the fabrication of a charge-coupled device wherein:

a semiconducting layer with a second type of doping is formed on a semiconducting substrate with a first type of doping;

this semiconducting layer is coated with an insulating layer, a series of electrodes, made of polycrystalline silicon, coated with an insulating material, is formed on this insulating layer, said electrodes being spaced out along an axis;

and then, in the second type of semiconducting layer, between the electrodes of said series, zones with a third type of doping are made, where one of said zones with a third type of doping extends also beyond the last electrode of the series along said axis, and wherein:

there is further formed, on the insulating layer, at least one additional polycrystalline silicon electrode, coated with an insulating material, at a distance from the last electrode of said series, along said axis, a zone is made, with a fourth type of doping, between the last electrode of the series and the additional electrode, in the zone with the third type of doping, and then there is made a series of polycrystalline silicon electrodes, respectively located so as to face the zones doped with a third and fourth type of doping, said electrodes being in contact with the insulating layer and respectively and partially covering the electrodes of said series and the supplementary electrode.

According to another characteristic of this method, there is further formed, on the insulating layer, a control electrode made of a polycrystalline silicon, at a distance from the last electrode of the said series, which partially covers said additional electrode, along said axis, and then a first zone and a second zone with a fifth type of doping are made in the semiconducting zone of the third type, on either side of the control electrode.

BRIEF DESCRIPTION OF THE DRAWINGS

The characteristics and advantages of the invention will appear more clearly from the following description, made with reference to the appended figures, wherein.

DETAILED DESCRIPTION OF THE INVENTION

Figure 4:
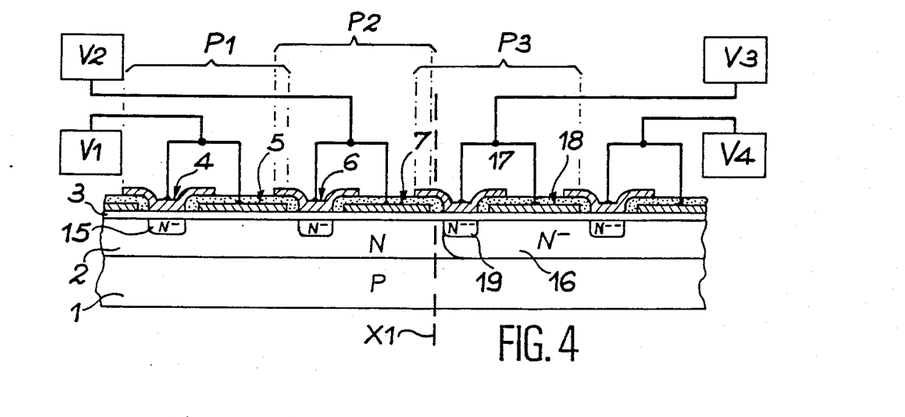
FIG. 4 gives a schematic, sectional view of a charge-coupled device according to the invention, said device having means used to create transfer potentials and potential wells of smaller values, from a downstream position.

The charge-coupled device, shown schematically in a section in FIG. 4, has a semiconductor substrate 1 with a first type of doping, a semiconducting layer 2 with a second type of doping that covers the substrate, and an insulating layer 3 covering this semiconducting layer. This device also has at least one first pair and at least one second pair of electrodes, P1, P2, along one and the same axis X, defining a direction of flow of the charges, between an upstream position, where the charges are created, and a downstream position, where they are to be detected. Each of said first and second pairs of electrodes, P1, P2, has, in the direction of flow X, a transfer electrode and a storage electrode. The transfer electrodes are represented at 4, 6, while the storage electrodes are represented at 5, 7. Each of these electrodes has a surface of contact with the insulating layer 3. As in prior art devices, this device also has means to create potential wells, PU1, PU2 (FIG. 6), with equal depths, beneath and facing the storage electrodes and identical transfer potentials, beneath and facing transfer and storage potentials, to make the charges flow in the chosen direction X.

According to the invention, the device comprises the following, starting from a downstream position X1, along the axis X, in the direction of flow, beyond the storage electrode 7: a semiconducting layer 16 with a third type of doping, made with the semiconducting layer 2 that has the second type of doping, as well as at least one third pair of electrodes P3. This third pair of electrode has, in the direction of flow, a transfer electrode 17 and a storage electrode 18, which has contact surfaces with the insulating layer 3. The device may also have other pairs of electrodes identical to the third pair P3. These electrodes are shown in the figure but have not been given references. The device also has means which shall be described further below and which enable the creation of transfer potentials beneath and facing the transfer and storage electrodes 17, 18 of the third pair which show, as shall be seen further below, bottom flat levels with smaller values that for existing bottom flat levels beneath and facing the transfer and storage electrodes of the first and second pairs.

The means used to create the potential wells PU1, PU2, with equal depths, beneath and facing the storage electrodes 5, 7, of the first and second pairs of electrodes P1, P2, and the transfer potentials with corresponding bottom flat levels having identical values, beneath and facing the transfer and storage electrodes of these first and second pair, have, as in FIG. 1, zones 15 with a third type of doping made in the semiconducting layer 2 of a second type. These zones of a third type are made beneath and facing contact surfaces of the transfer electrodes 4, 6, of the first and second pairs P1 and P2. These means also have a first voltage source and a second voltage source V1, V2, respectively connected to the electrodes 4, 5, of the first pair and to the electrodes 6, 7, of the second pair. These voltages, as shown in the graph of FIG. 5, vary cyclically and in phase opposition, between a first value V0, which may be the ground potential for example, and a second maximum value V1 (which is positive in the embodiment described).

The means which make it possible to create, beneath and facing the electrodes of the third pair, transfer potentials having bottom flat levels with values below those of the transfer potentials, beneath and facing the electrodes of the first and second pairs, comprises a fourth type of doped zone 19 beneath and facing the storage electrode 17 of the third pair P3. This fourth type of doped zone is made in the semiconducting layer 16 with the third type of doping. These means also have a voltage source V3 connected to the electrodes 17, 18, of the third pair. This voltage varies cyclically and in phase with the voltage V1, applied to the electrodes 4, 5, of the first pair, as shown in the graph of FIG. 5. The voltage V3 varies cyclically between the first minimum value V0 of the voltages applied to the electrodes of the first and second pairs and a third value V3 which is greater than the second value VM of the voltages V1 and V2.

Figure 5:
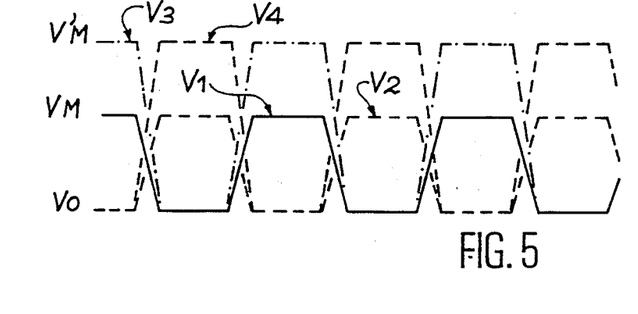
FIG. 5 is a graph of the voltages applied to the different electrodes of the device of FIG. 4.

This FIG. 5 also shows a voltage source V4 which could supply other electrodes identical to those of the third pair. This voltage source gives a cyclical voltage V4, in phase opposition with the phase V3 and having the same extreme values as these voltages, as shown in the graph of FIG. 5.

Figure 6:
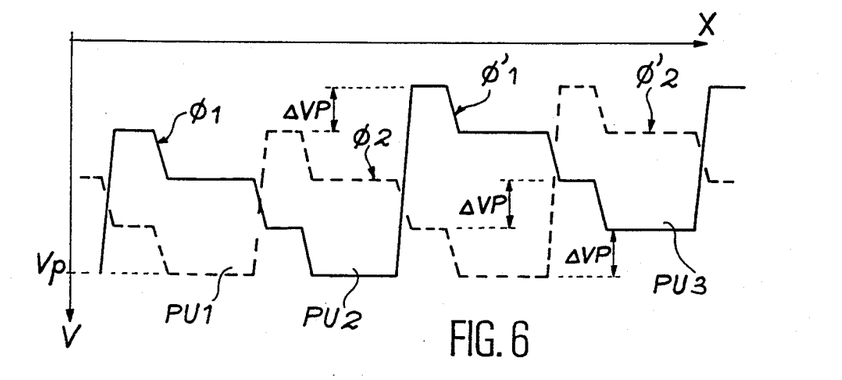
FIG. 6 is a graph representing the transfer potentials and the potential wells, along an axis X of the flow of charges, at the interface between the semiconducting layer and the insulating layer in the device of FIG. 4.

The curves $\phi 1$, $\phi 2$ of FIG. 6 represent the transfer potentials and the potential wells PU1, PU2 with a depth VP, created at the interface between the semiconducting layers 2 and the insulating layer 3, beneath the first pairs of electrodes, P1 and P2. These wells and transfer potentials are identical to those of FIG. 3 for the first two pairs of electrodes P1, P2.

The curves, $\phi'1$ and $\phi'2$ represent the transfer potentials and the potential wells created at the interface between the fourth type semiconducting layer 16 and the insulating layer 3, when the cyclical voltages V3 and V4 are respectively applied to the third pair of electrodes P3 and to the following pairs of electrodes, in the direction of flow of charges. The voltages V3, V4, vary cyclically between the first value V0 of the voltages V1 and V2, and the value V'M greater that the voltage VM. It is seen in the curves, $\phi'1$, $\phi'2$, that the potentials wells, appearing beneath the storage electrode of the third pair and the following pairs, have a smaller depth than the potential wells beneath the storage electrodes of the first and second pair of electrodes. The transfer potentials too have smaller bottom flat level values than for the first and second pairs. In fact, the lower degree of doping of the semiconducting layer 16, as compared with the doping of the semiconducting layer 2, and the lower degree of doping of the zones 19, beneath the transfer electrode such as 17, make it possible to reduce the values of the bottom flat levels of the transfer potentials and also to reduce the depth of the potential wells by a quantity with a value $\Delta$VP. The lock system mentioned earlier is thus achieved starting from the downstream position X1. It is precisely the reduction in the values of the transfer potentials that is valuable, as shall be seen in greater detail below.

In a preferred embodiment of the device of the invention, the first type of doping of the semiconducting substrate 1 is a P type doping. The second type doping of the semiconducting layer 2 is an N type. The semiconducting layer 16, as well as the zones 15, with a third type of doping, are of the N$^-$ type. The zones 15 actually have a lower level of doping than the semiconducting layer 2 with N type doing. The semiconducting zones, with a fourth type of doping, such as the zone 19 beneath the transfer electrode 17, are N$^{--}$ type zones wih a lower level of doping than the semiconducting layer 16 with N$^-$ type doping. The quantities of dopant for the zones 15 of the N$^-$ type and the layer 16 of the N$^-$type may be equal or different.

Figure 7:
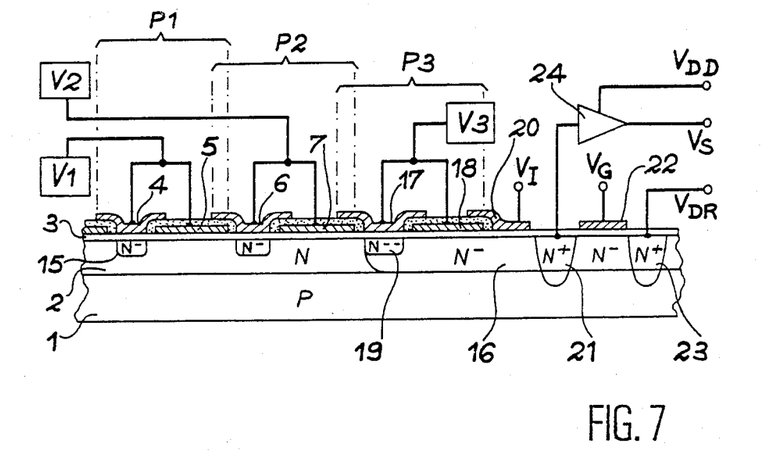
FIG. 7 gives a schematic, sectional view of a charge-coupled device according to the invention, comprising, from a downstream end, means to detect and measure the charges that get collected at this end.

FIG. 7 gives a schematic, sectional view of a device according to the invention which has, herein, means to detect the charges that get collected beneath the storage electrodes 18 of the third pair. The same elements carry the same references in this figure and in FIG. 4.

The means used to detect the charges that get collected beneath the storage electrode 18 of the third pair include an intermediate electrode 20 which is adjacent to the storage electrode 18 of the third pair and in contact with the insulating layer 3. These means also include a control electrode 22, at a distance from the intermediate electrode 2 and in contact with the insulating layer 3.

A first semiconducting zone 21, with a fifth type of doping, is made in the semiconducting layer 16, with the third type of doping, between the intermediate electrode 20 and the control electrode 2. A second semiconducting zone 23, with a fifth type of doping, is also made in the semiconducting layer 16 of the third type, in a portion of this layer, adjacent to the control electrode 22 in the direction of flow of the charges.

The control electrode 22, the intermediate electrode 20 and the second zone 23 are respectively connected to voltage sources VG, VI and VDR, which enable the creation of a potential well PU4, beneath and facing the first zone 21, and enable the transfer, into this potential well P3, of the charges stored beneath the storage electrode 18. This well, as shall be seen in detail further below, has aa smaller depth than that of the wells beneath the storage electrodes of the first and second pairs. This smaller depth is obtained, notably, by diminishing, through the third pair of electrodes and through the particular doping of the semiconducting layer beneath these electrodes, the values of the bottom flat levels of the transfer potentials of the charges stored beneath the electrode 18 of the third pair.

The first semiconducting zone 21, of the fifth type, is connected to an amplifier for the reading of the charges that get collected in the potential well beneath and facing this first zone. This amplifier is connected to a supply voltage source $V_{DD}$. Owing to the lock system, the value of this supply voltage of the read amplifier is smaller than the value of the supply voltage normally required for prior art charge-coupled devices, wherein there are no means to reduce the values of the bottom flat levels of the transfer potentials beneath and facing the last pair of electrodes.

In a preferred embodiment, the semiconducting zones 21, 23, with a fifth type of doping, are of the N$^+$ type. These zones have higher degree of doping than the semiconducting layer with the second type (N type) doping.

Figure 8:
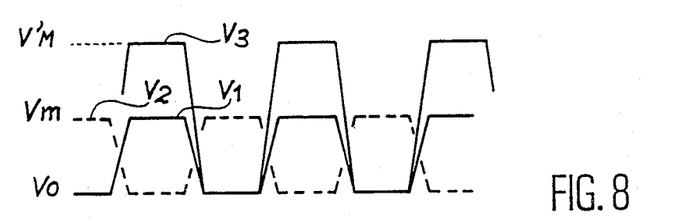
FIG. 8 is a graph of the voltages applied to the main electrodes of the device of FIG. 7.

FIG. 8 is a graph of the voltage V1, V2, V3, applied, respectively, to the first, second and third pairs of electrodes. As in the embodiment shown in FIG. 4, the voltages V1 and V2 are voltages which vary cyclically, and in phase opposition, between a value V0 and a value $V_M$, while the voltage V3 is in phase with the voltage V1 but has a value V'm greater than VM.

Figure 9:
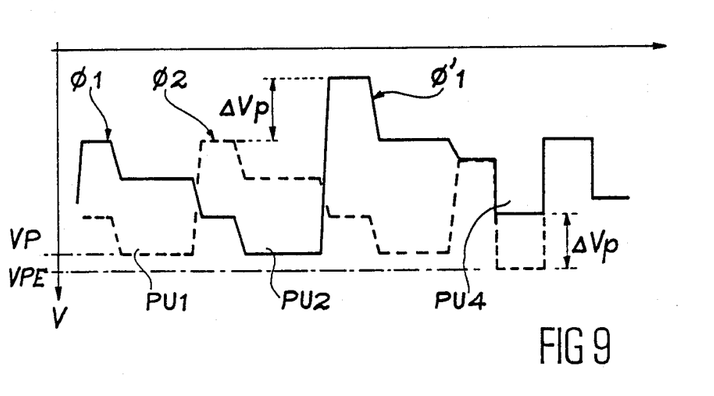
FIG. 9 is a graph representing the essential potentials that appear at the interface between the semiconducting layer and the insulating layer in the device of FIG. 7.

FIG. 9 is a graph of the potentials that appear beneath the transfer electrodes and the storage electrodes of the device of FIG. 7, as well as beneath the intermediate and control electrodes. This graph also shows the potential well PU4, in the first doped zone 21 with the N$^+$ type doping. The potential wells, PU1, PU2, beneath the storage electrodes 5, 7, of the first and second pairs are identical to those of FIG. 6, and have the same depth $V_p$. As indicated earlier, the embodiment of FIG. 6, the doping of the semiconducting layer 16 and the presence of the doped zone 19, beneath the transfer electrode 17, make it possible to lower the transfer potentials of the charges stored beneath the last storage electrode 7. These potentials are represented by $\phi'1$ in the graph. The intermediate electrode 20, to which a voltage VI is appled, makes it possible to create a potential bottom flat level with a value sufficient to cause the flow of the stored charges towards the potential well PU4 beneath and facing the zone 21. The amplifier 24, one input of which is connected to this zone, gives a voltage VS which is proportionate to the quantity of charges that get collected in the potential well PU4. In fact, through the third pair of electrodes P3, which enables a reduction by a quantity $\Delta VP$ in the transfer potentials, the supply voltage $V_{DD}$ of the read amplifier 24 can be reduced to the same extent. The zones 21, 23 and the electrode 22, respectiively connected to the amplifier 24, to a voltage source VDR and to a voltage source VG, in fact form a MOS type transistor. The electrode 22 is the gate of this transistor, and the zone 23 and 21 respectively represent the drain and the source of this transistor. The tension applied to the gate VG, when the chrges are stored in the potential well P3, enable these charges to be measured by the read amplifier 24.

FIGS. 10 to 15 give a schematic view of the essential steps in a first mode of implementation of a method for fabricating a device according to the invention.

Figure 10:
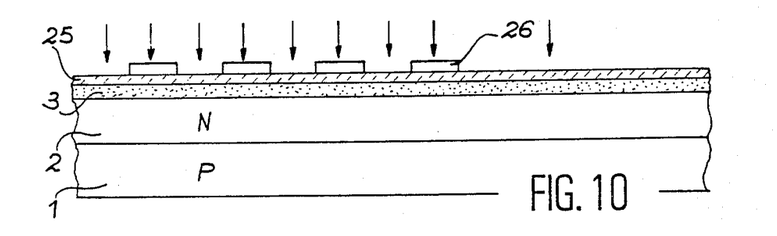
FIGS. 10 to 15 show a schematic view of the essential steps of a method for the fabrication of the device, according to the invention, for a first mode of implementation of this method.

As shown schematically in FIG. 10, the method consists, firstly, in forming, on a semiconductor substrate 1 (silicon for example), with a first type of doping (preferably of the P type), a semiconducting layer 2 (made of silicon) doped with a second type of doping (preferably of the N type), and in then coating this semiconducting layer 2 with an insulating layer 3, such as an oxide for example.

Figure 11:
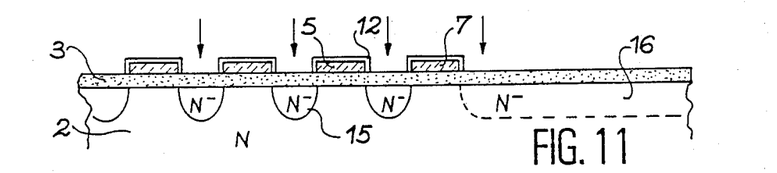

The method then consists in forming, on this insulating layer 3, a series of electrodes 4, 5, 6, 7 (the number of which is clearly not restricted to 4), covered with an insulating material 12 as shown in FIG. 11. These electrodes are got by depositing a layer 25 made of a polycrystalline silicon, for example, on the insulating layer 3. On this layer 25, there is placed a mask 26 by which these electrodes can be etched as shown in FIG. 10. The insulating material which covers each of the electrodes can be obtained by heat treatment of the polycrystalline silicon after the etching of the electrodes. The electrodes 4, 5, 6, 7, are evenly spaced out along an axis, and then (FIG. 11) a third type of doping (preferably of the $N^-$ type) is made in the semiconducting layer 2 of the second type (N) between the electrodes of the series of electrodes 4, 5, 6, 7. This third type of doping ($N^-$) is also made beyond the last electrode 7 of the series of electrodes in the zone 16 of the semiconducting layer 2.

Figure 12:
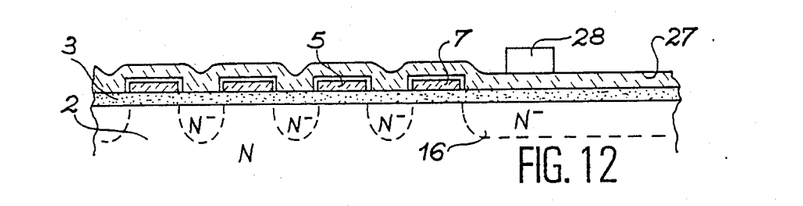

The procedure then consists in forming at least one additional electrode 18 (shown in FIG. 13) on the insulating layer 3. This additional electrode is obtained, as shown in FIG. 12, by depositing a layer 27 of polycrystalline silicon on the already made electrodes and on the insulating layers not covered by these electrodes, and in then removing this polycrystalline silicon layer 27 by etching. This etching is delineated by a mask 28 which covers only that portion of the polycrystalline silicon which corresponds to the electrode 18 to be obtained. When this electrode is obtained, it is covered with an insulating material. The electrode 18 forms the storage electrode of the third pair described further above.

Figure 13:
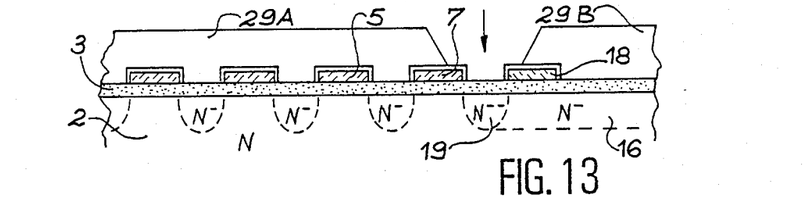

Then, as shown in FIG. 13, a fourth type of doping (preferably $N^{--}$) is made between the last electrode 7 of the series and the additional electrode 18 in the third type of doped zone 16 ($N^-$). To this effect, all the electrodes already made are coated with a protective mask 29A, 29B, which is removed after making the fourth type of zone 19 ($N^{--}$).

Figure 15:
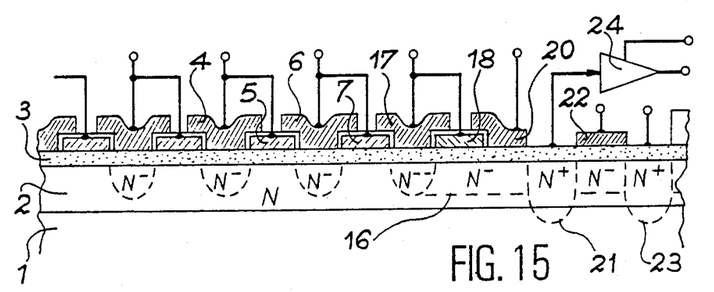

This method then consists, as shown in FIG. 15, in making a series of electrodes 4, 6, 17, 20, 22, of polycrystalline silicon, located so as to face doped zones of a third type ($N^-$) and doped zones of a fourth type ($N^{--}$). These electrodes are in contact with the insulating layer 3. They respectively and partially cover the surrounding electrodes such as 5, 7, for example, as well as the doped zones of the third type ($N^-$ and $N^{--}$). An intermediate electrode 20 partially covers the additional electrode 18.

Figure 14:
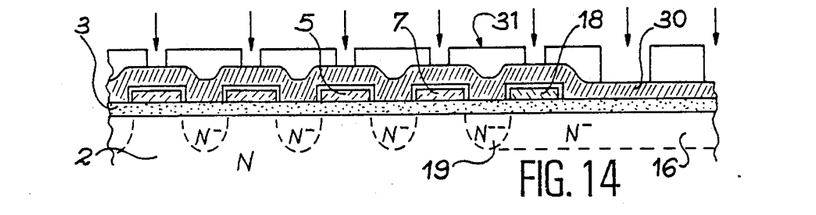

This method also consists in forming, on the insulating layer 3, a polycrystalline silicon control electrode 22, coated with an insulated material and at a distance from the intermediate electrode 20. All these electrodes are obtained, as shown in FIG. 14, in coating the electrodes such as 5, 7, 18 as well as the insulating layer 3 with a polycrystalline silicon deposit 30. This deposit is then coated with a mask 31 which enables the polycrystalline silicon deposit 30 to be etched so as to leave only the electrodes such as 4, 6, 17, 20, 22, the already made electrodes being shielded by the insulating layer which covers them. A fifth type of doping (preferably of the $N^+$ type) is then made on either side of the control electrode 22 in the $N^-$ type semiconducting layer. The electrodes may then be provided with their connection wires enabling them to be connected to the supply sources.

The fourth ($N^{--}$) type of doped zone has a lower level of doping than the zones with the third type of doping ($N^-$). The zone with the fifth type ($N^+$) of doping has, on the contrary, a lower level of doping than the semiconducting layer 2 with the second type of doping (N).

Figure 16:
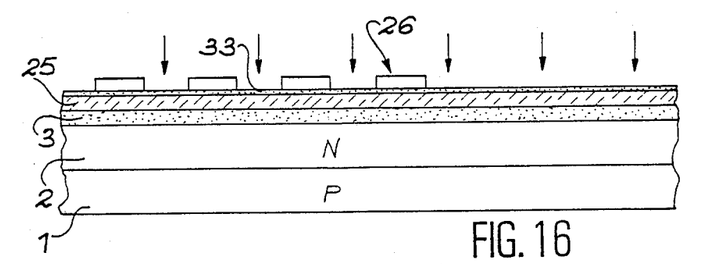
FIGS. 16 to 18 represent certain steps in the fabrication of the device, according to the invention, for another mode of implementation of this manufacturing method.
Figure 17:
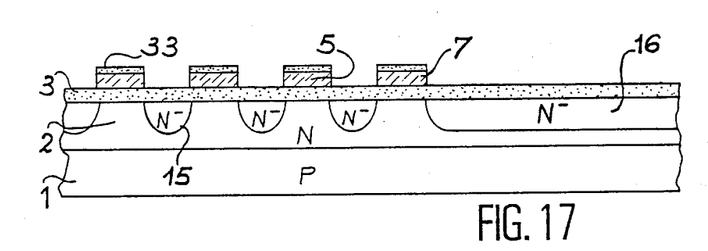
Figure 18:
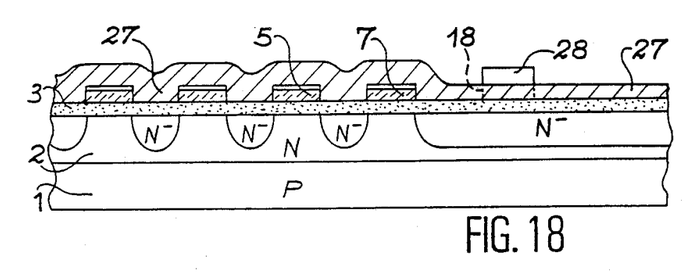

FIGS. 16 to 18 give a schematic view of the essential steps in another method of implementing the method for fabricating the device of the invention. In these figures, the references correspond to those of FIGS. 10 to 12 above. In this mode of implementation, the polycrystalline silicon 25, which is deposited on the insulating layer 3 is coated, before being cut out by etching through a mask 26, with an insulating deposit 33. It is only thereafter that the electrodes such as 5, 7, are cut out as shown in FIG. 7, and that the semiconducting zones of the third type ($N^-$) are implanted between these electrodes.

The method then consists in depositing a polycrystalline silicon layer 27 which is etched through a resin mask 28 to form the additional electrode 18, the previously etched electrodes 5 and 7 being shielded by the insulating deposit 33, located on their upper parts. Then the insulation of the electrode 18 and of the flanks of the electrodes 5 and 7 is done. The rest of the process is identical to that of the previous case.

This mode of implementation has the following advantage as compared with the previous one: in the previous mode of implementation, the oxidation of the surface of the electrodes is done after these electrodes are cut out. The result thereof is that the insulating layer 3 has a variable thickness since it is not shielded during this oxidation of the electrodes. In the second mode of implementation, the insulation of the surface of the electrodes is made before the polycrystalline layer 25 is cut out. The result thereof is that, after the cutting out of these electrodes coated with their insulating material, the insulating layer 3 undergoes no additional oxidation which would modify its thickness beneath the additional electrode 18 which is made subsequently.

The lateral insulation of the electrodes 5 and 7 as well as the insulation of the additional electrode 18 are thus achieved.

What is claimed is:

1. A charge-coupled device comprising:

a semiconductor substrate with first type of doping, a semiconductor layer with a second type of doping covering this substrate, an insulating layer covering this semiconducting layer, and, along one and the same axis defining a direction of flow of charges between an upstream position and an downstream position, at least one first pair and one second pair of electrodes, each comprising, in said direction, a transfer electrode and a storage electrode having surfaces of contact with the insulating layer, with zones of a third type of doping being made so as to face the contact surfaces of the transfer electrodes of the first and second pairs, in the semiconducting layer of the second type, the electrodes of the first and second pairs being respectively connected to a first source and a second source of voltage varying cyclically and in phase opposition, between a first value and a second value, to create potential wells of equal depths, beneath and facing the storage electrodes, and identical and phase shifted potentials beneath and facing the transfer and storage electrodes of the first pair and the second pair, to make the charges flow in said direction;

said device comprising, from the downstream position, along said axis, in the direction of flow;

a semiconducting layer with a third type of doping made in the layer with the second type of doping, at least one third pair of electrodes comprising, in said direction, a transfer electrode and a storage electrode having surfaces of contact with the insulating layer, and comprising means to create transfer potentials, beneath and facing the electrodes of the third pair, with values smaller than those of the transfer potentials beneath and facing the transfer and storage electrodes of the first pair and second pair.

2. A device according to claim 1, wherein the means used to create, beneath and facing the electrodes of the third pair, transfer potentials with values below those of the first and second pairs of electrodes, comprise a zone with a fourth type of doping, beneath and facing the transfer electrode of the third pair, in the semiconducting layer with a third type of doping, the transfer and storage electrodes of the third pair being connected to a voltage source which varies cyclically and in phase with the voltage applied to the electrodes of the first pair, said voltage varying between said first value and a third value which is greater than the second value.

3. A device according to claim 2, wherein the semiconductor substrate with a first type of doping has P type doping, the semiconductor layer with a second type of doping has N type doping, the semiconductor layer and the semiconductor zones with the third type of doping have $N^-$ type doping and have a lower level of doping than the semiconducting layer with the second type of doping, the semiconducting zone with the fourth type of doping being $N^{--}$ type doped, with a lower level of doping than the semiconducting layer that has a third $N^-$ type doping.

4. A device according to claim 2, further comprising means to detect the charges that have collected beneath the storage electrode of the third pair, said means comprising an intermediate electrode which is adjacent to the storage electrode of the third pair and is in contact with the insulating layer, and a control electrode at a distance from the intermediate electrode in contact with the insulating layer, a semiconducting zone, with a fifth type of doping, made in the semiconducting layer with a third type of doping, in a zone beneath and facing the space located between the intermediate electrode and the control electrode, and a second semiconducting zone, with a fifth type of doping, made in the semiconducting layer with a third type of doping, in a zone adjacent to the control electrode, in the direction of the flow of charges; the control electrode, the second zone and the intermediate electrode being respectively connected to voltage sources to create a potential well beneath and facing the first zone with a smaller depth than that of the potential well beneath the storage electrodes of the first pair and the second pair, the first zone being connected to an amplifier for the measurement of the charges that collected in the potential well beneath and facing this first zone.

5. A device according to claim 4, wherein the first and second semiconducting zones, with a fifth type of doping, have $N^+$ type doping of a higher level than the semiconducting layer with the second type N doping.

* * * * *